United States Patent [19]

Wang et al.

[11] Patent Number: 5,899,726
[45] Date of Patent: May 4, 1999

[54] METHOD OF FORMING OXIDE ISOLATION IN A SEMICONDUCTOR DEVICE

[75] Inventors: Hsingya Arthur Wang, Saratoga; Mark T. Ramsbey, Sunnyvale; Jein-Chen Young, Milpitas, all of Calif.

[73] Assignee: Advanced Micro Devices, Inc., Sunnyvale, Calif.

[21] Appl. No.: 08/891,920

[22] Filed: Jul. 14, 1997

Related U.S. Application Data

[63] Continuation of application No. 08/569,441, Dec. 8, 1995, abandoned.

[51] Int. Cl.$^6$ ................................................ H01L 21/76
[52] U.S. Cl. ......................................................... 438/439
[58] Field of Search ........................... 438/439, FOR 229; 148/DIG. 85, DIG. 86

[56] References Cited

U.S. PATENT DOCUMENTS

| | | |
|---|---|---|
| 4,666,556 | 5/1987 | Fulton et al. ............................. 437/69 |
| 5,286,672 | 2/1994 | Hodges et al. . | |

FOREIGN PATENT DOCUMENTS

| | | |
|---|---|---|
| 62-76654 | 4/1987 | Japan . |
| 63-275137 | 11/1988 | Japan . |
| 230134 | 1/1990 | Japan . |
| 2205029 | 8/1990 | Japan . |
| 6163531 | 6/1994 | Japan . |

OTHER PUBLICATIONS

Martin, R., "Spacer for Improved Local Oxidation Profile", IBM Tech. Disc. Bull. No. 5, vol. 12, Sep., Oct. 1987, pp. 351–353.

*Primary Examiner*—George Fourson
*Attorney, Agent, or Firm*—Skjerven, Morrill, MacPherson, Franklin & Friel; Edward C. Kwok

[57] ABSTRACT

After providing a patterned nitride layer over a patterned layer of oxide in turn disposed on a silicon substrate, a covering layer of oxide or polysilicon is deposited over the resulting structure to contact the substrate to hold the patterned nitride layer portions in position as field oxide is grown. In addition, field oxide growth rate slows at the edges of the nitride layer portions, allowing additional time for field oxide to flow as it is grown, relieving lifting force on the nitride layer portions, and providing an increase in silicon active area between field oxide regions.

11 Claims, 3 Drawing Sheets

METHOD OF FORMING OXIDE ISOLATION IN A SEMICONDUCTOR DEVICE

This application is a continuation of U.S. application Ser. No. 08/569,441, filed Dec. 8, 1995, now abandoned.

FIELD OF THE INVENTION

This invention relates to growth of field oxide regions in a semiconductor device, and more particularly, to a method of such growth wherein stress on a patterned nitride layer used to define such field oxide regions is reduced during such field oxide growth.

BACKGROUND OF THE INVENTION

With reference to FIGS. 1, 2 and 3, a typical method of growing field oxide ($SiO_2$) in a semiconductor device is shown. Initially (FIG. 2), a semiconductor substrate 10 is provided, and a thin layer of silicon dioxide ($SiO_2$) 12 is grown thereover. A silicon nitride ($Si_3N_4$) layer 14 is patterned over the oxide layer 12 as is well known, resulting in nitride layer portion 14A, 14B and 14C shown in cross section in FIG. 2. These nitride layer portions 14A, 14B, 14C may be quite long as shown in FIG. 1, and are used to define regions therebetween in which field oxide will be grown.

The thin oxide layer 12 is then patterned to the configuration of the nitride layer 14 (FIG. 2) forming oxide layer portions 12A, 12B, 12C. This leaves exposed areas 10A of the silicon substrate 10 which will subsequently be oxidized to form field silicon dioxide ($SiO_2$) regions 16A, 16B, 16C.

An important fact for consideration is that during the conversion of silicon to silicon dioxide (FIG. 3), the volume of material from original silicon to silicon dioxide is increased by a factor of approximately two. With such field oxide typically being grown at 1100° C., the silicon dioxide has a glass transition temperature at approximately 950° C., so that at 950° C. or greater, the silicon dioxide has a viscous flow. However, even with such viscous flow, the increase in volume as the silicon is converted to silicon dioxide, along with the fact that the silicon dioxide grows rapidly at 1100° C., causes substantial stress to be placed on the edges of the nitride layer portions 14A, 14B, 14C as the oxide grows thereunder. That is, a large lifting force is applied to the nitride layer portions 14A, 14B, 14C along the elongated sides thereof, and particularly at the tip thereof where such lifting force is applied on three sides of the nitride layer portion 14A (FIG. 1). With dimensions of semiconductor devices becoming ever smaller, a width of a nitride layer portion 14A may for example be 0.5 micron. Because a small area of nitride layer portion 14A is in contact with the underlying oxide 12, which contact area grows smaller and smaller as the field oxide is grown inward under the nitride layer portion 14A, the force holding the nitride layer portion 14A in place may be reduced to the point where under the lifting force of the growing field oxide region, the nitride layer portion 14A lifts away from the thin oxide 12 to form a void 18 thereunder. And, as pointed out above, the faster the field oxide is grown, the less time is allowed for oxide flow to alleviate such stress on the nitride layer portion 14A.

Obviously, creation of such a void in a semiconductor device is undesirable and can lead to device failure.

In addition, with the contact area of the nitride layer portion 14A becoming smaller and smaller as the field oxide is grown inward under the nitride layer portion 14A, the silicon surface remaining for incorporation of circuit elements is reduced.

SUMMARY OF THE INVENTION

The present invention overcomes the above-cited problems by providing that subsequent to provision of a patterned nitride layer over a layer of pad oxide, the pad oxide layer is patterned, exposing areas of silicon, and then a covering layer of oxide is deposited thereover to contact the substrate to hold the patterned nitride layer portions in position as field oxide is grown. As an alternative, a thin layer of polysilicon can be applied and oxidized to form the covering layer. In addition, with the covering oxide layer in place, field oxide growth slows at the edges of the nitride layer portions as compared to the prior art, since during the oxidation process oxygen must diffuse through the covering oxide to the oxide-silicon interface. This allows additional time for the oxide to flow, relieving lifting force on the nitride layer portions, and providing an increase in the area of silicon between field oxide regions, as compared to the prior art.

DESCRIPTION OF THE PREFERRED EMBODIMENT

Figure 1:
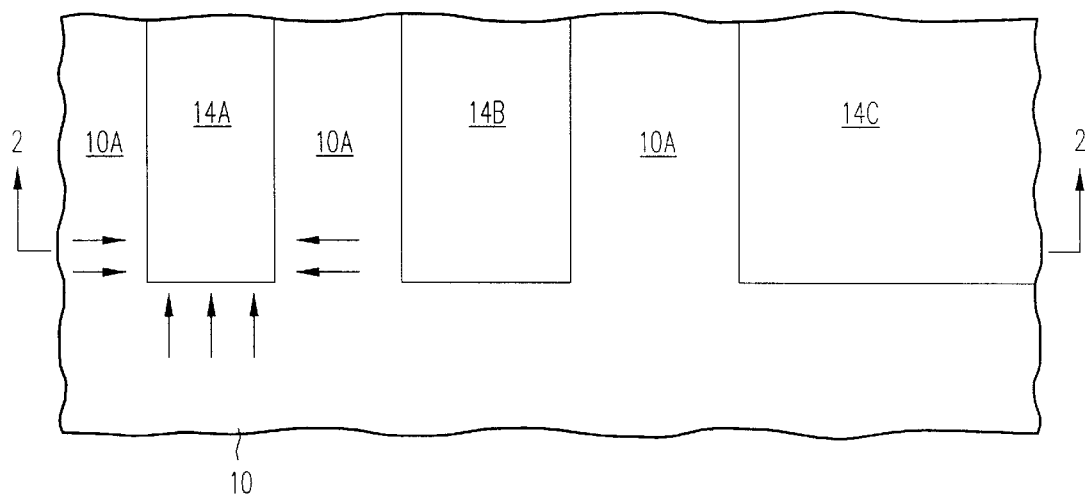
FIG. 1 is a plan view of a prior art semiconductor device.
Figure 2:
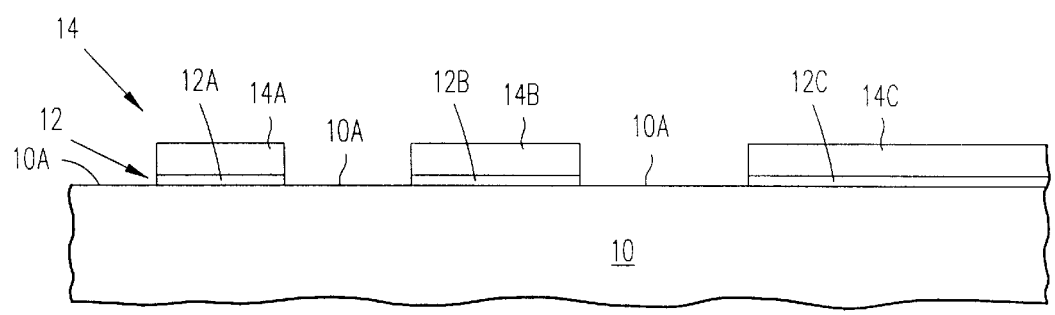
FIG. 2 is a sectional view taken along the line 2—2 of FIG. 1.
Figure 3:
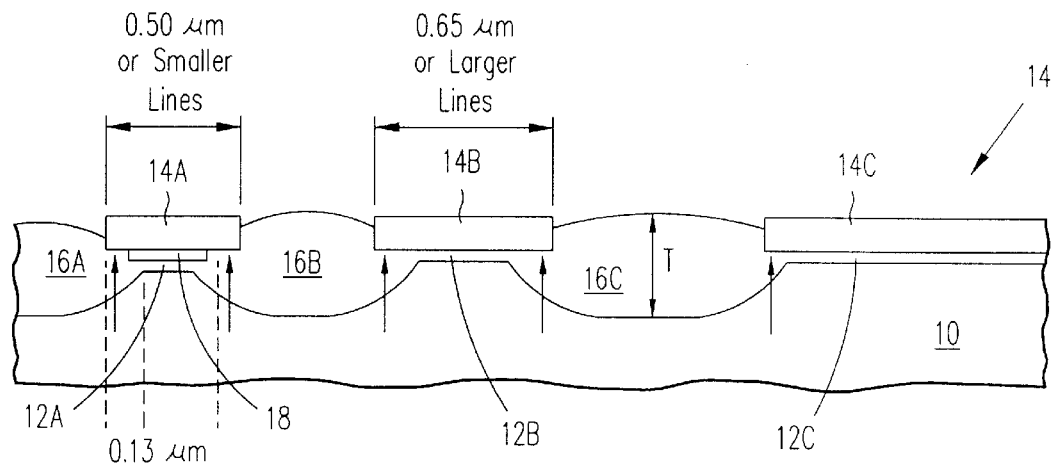
FIG. 3 is a sectional view similar to that shown in FIG. 2, subsequent to growth of field oxide.
Figure 4:
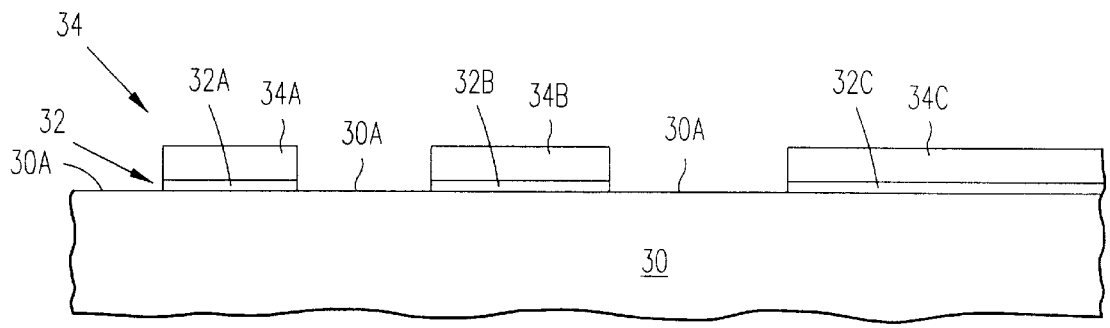
FIG. 4 is a sectional view of a semiconductor device showing a state therein in accordance with the present invention.
Figure 5:
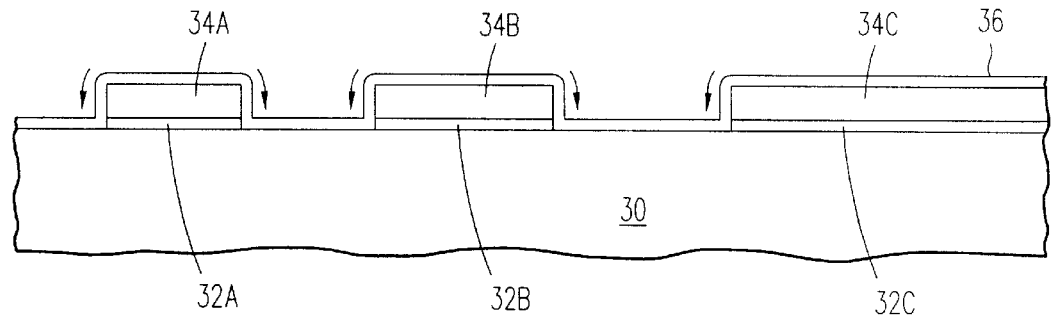
FIG. 5 is a sectional view similar to that shown in FIG. 4 but showing application of an oxide or polysilicon layer.
Figure 6:
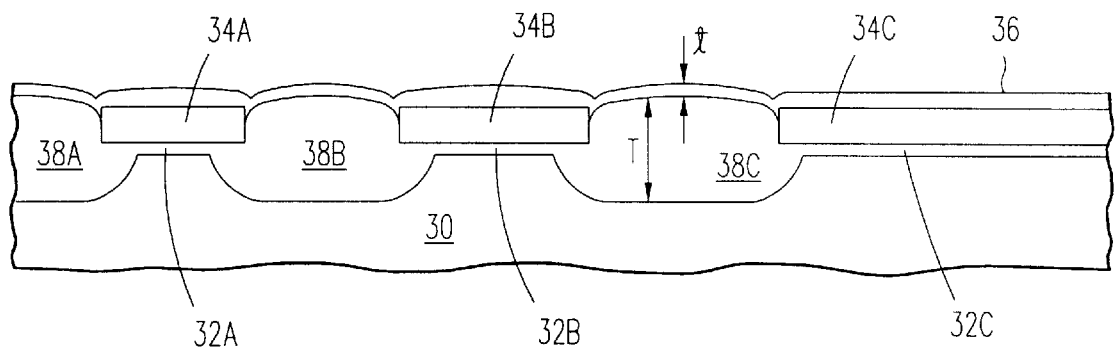
FIG. 6 is a view similar to that shown in FIG. 5 but subsequent to growth of field oxide.

With reference to FIG. 4, shown therein is a silicon substrate 30 on which is disposed a pad silicon dioxide ($SiO_2$) layer 32, having in turn disposed thereon a patterned silicon nitride ($Si_3N_4$) layer 34, including layer portions 34A, 34B, 34C. The nitride layer portion 34A of FIG. 4 may, for example, be 0.5 $\mu$m wide. The oxide layer 32 is patterned to conform to the pattern of the nitride layer 34, forming oxide layer portions 32A, 32B, 32C, and exposing areas 30A of silicon between the nitride layer portions 34A, 34B, 34C. A thin covering layer of silicon dioxide ($SiO_2$) 36 is deposited over the resulting structure (FIG. 5), adhering to the nitride layer portions 34A, 34B, 34C and the exposed areas 30A of the silicon substrate 30. This thin oxide layer 36 may be for example 200 to 800 Å thick. Then, field silicon dioxide ($SiO_2$) regions 38A, 38B, 38C are grown at approximately 1100° C. between the patterned nitride layer portions 34A, 34B, 34C (FIG. 6).

During the growth of such field oxide regions 38A, 38B, 38C the thin oxide layer 36 adhering to the silicon substrate 30 helps to hold the nitride layer portions 34A, 34B, 34C down to the pad oxide portions 32A, 32B, 32C while field oxidation progresses. The thin oxide layer 36 also slows down the rate of oxidation at the areas of the encroachment of the field oxide under the nitride layer portions 34A, 34B, 34C. Since the rate of oxidation at these points is reduced, more time is allowed for the growing field oxide to flow so as to reduce the force which tends to raise the nitride layer portions 34A, 34B, 34C from the pad oxide 32A, 32B, 32C. Thus, the problem of forming voids under the nitride layer portions 34A, 34B, 34C as previously described is averted.

Figure 7:
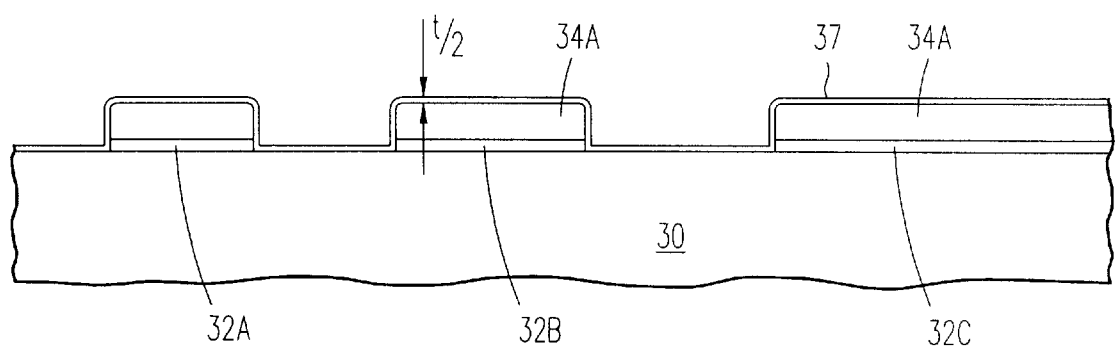
FIG. 7 is a view similar to that shown in FIG. 6 but showing removal of the top oxide layer and nitride layer portions.

As an alternative, instead of depositing oxide 36, a covering layer of polysilicon 37 can be deposited (FIG. 7), and then oxidized to form silicon dioxide (SiO$_2$)as the field oxide is grown. It will be seen however, that the end result and advantages attendant thereto are substantially the same.

If, for example, the deposited oxide 36 is t in thickness, the equivalent polysilicon layer 37 required to form such an oxide layer would be t2in thickness.

The time required to form a final field oxide of thickness T as compared to the prior art will be increased as follows:

If in the prior art system described Time 1 is required to grow a field oxide of thickness T, then T=√D·(Time 1).

In the present case, if Time 2 is required to grow a field oxide of final thickness T, where t+T=√D·(Time 2).

$$\text{Time 2} = \text{Time 1} + \frac{t^2}{D} + \frac{2t}{\sqrt{D}}\sqrt{\text{Time 1}}$$

Several advantages are attendant to the present method. If the deposited covering oxide layer 36 or polysilicon layer 37 is chosen to be very thin, this method particularly aids in the holding down of the nitride layer portions 34A, 34B, 34C. If the deposited layer 36 or 37 is chosen as relatively thick, with oxidation done at for example ≧1050° C., the rate of oxidation is slowed down sufficiently to allow for stress reducing flow of the growing field oxide. Furthermore, both advantages can be achieved by appropriate choosing of the thickness of the oxide layer 36 or polysilicon layer 37.

In addition, because the rate of oxidation is reduced at the areas of encroachment under the edge of the nitride layer portions 34A, 34B, 34C the surface portions of the silicon substrate where circuit elements are placed is larger than in the prior art.

Figure 8:
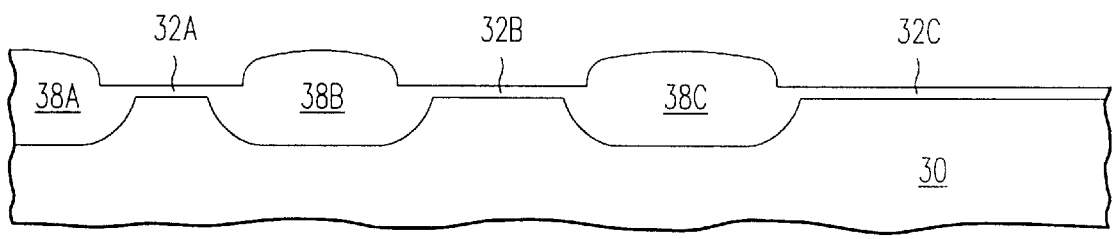

Finally, the deposited silicon dioxide or oxidized polysilicon layer is removed by either wet etch (HF, BOE, etc.), or plasma etch. Then, the nitride layer portions 34A, 34B, 34C are stripped in hot phosphoric acid (H$_3$PO$_4$), so as to achieve the structure shown in FIG. 8.

We claim:

1. A method of fabricating a semiconductor device comprising:

providing a semiconductor body with a dielectric layer;

providing a patterned nitride layer in contact with said dielectric layer and over the semiconductor body, exposing a portion of said dielectric layer;

providing an oxide layer over the resulting structure, a portion of which is in contact with said dielectric layer; and with the oxide layer intact over the resulting structure, growing a field oxide in a region adjacent a side of a portion of the nitride layer.

2. The method of claim 1 wherein the step of providing an oxide layer over the resulting structure comprises depositing said oxide layer.

3. The method of claim 1 wherein the step of providing an oxide layer over the resulting structure comprises depositing a polysilicon layer over the resulting structure, and oxidizing said polysilicon layer.

4. The method of claim 1 and further comprising the step of providing that the oxide layer is relatively thin as compared to the thickness of the grown field oxide.

5. The method of claim 1 and further comprising the step that subsequent to growing said field oxide, the oxide layer is removed from over the nitride layer.

6. The method of claim 5 and further comprising the step that subsequent to removing said oxide layer from over said nitride layer, said nitride layer is removed.

7. A method of fabricating a semiconductor device comprising:

providing a semiconductor body;

providing a first oxide layer over the semiconductor body;

providing a patterned nitride layer in contact with and over the first oxide layer said patterned nitride layer leaving a portion of the semiconductor body exposed;

providing a second oxide layer over the resulting structure, a portion of which is in contact with the semiconductor body; and with the second oxide layer intact over the resulting structure, growing a field oxide in a region between portions of the nitride layer.

8. The method of claim 7 wherein the step of providing a second oxide layer over the resulting structure comprises depositing said oxide layer.

9. The method of claim 7 wherein the step of providing a second oxide layer over the resulting structure comprises depositing a polysilicon layer over the resulting structure, and oxidizing said polysilicon layer.

10. The method of claim 9 and further comprising removing said second oxide layer from over the nitride layer subsequent to growing said field oxide.

11. The method of claim 10 and further comprising removing said nitride layer subsequent to removing said second oxide layer from over said nitride layer.

* * * * *